United States Patent [19]

Sasov

[11] Patent Number: 5,943,213
[45] Date of Patent: Aug. 24, 1999

[54] THREE-DIMENSIONAL ELECTRONIC MODULE

[75] Inventor: Yuriy Dmitrievich Sasov, Moscow, Russian Federation

[73] Assignee: R-Amtech International, Inc., Bellevue, Wash.

[21] Appl. No.: 09/121,533

[22] Filed: Jul. 24, 1998

[30] Foreign Application Priority Data

Nov. 3, 1997 [RU] Russian Federation ............. 97117557

[51] Int. Cl.⁶ .................................................. H05K 7/20
[52] U.S. Cl. .......................... 361/705; 361/695; 361/704; 361/720; 361/735; 257/686; 257/723; 174/52.4; 165/80.3
[58] Field of Search ..................................... 361/689, 700, 361/703–709, 720, 730, 735, 739, 728, 760, 790, 749; 257/686, 691, 668, 697, 676, 703–713, 684, 784, 700, 699, 723–725, 666; 174/52.4; 200/307; 206/305; 29/830; 250/208.1; 165/80.3, 80.4, 185

[56] References Cited

U.S. PATENT DOCUMENTS

| | | | |
|---|---|---|---|
| 3,029,495 | 4/1962 | Doctor | ...................................... 29/830 |
| 3,164,750 | 1/1965 | Miller . | |
| 3,290,559 | 12/1966 | Kirby et al. . | |
| 3,746,934 | 7/1973 | Stein . | |
| 3,904,933 | 9/1975 | Davis . | |
| 4,103,318 | 7/1978 | Schwede | ................................. 361/707 |
| 4,587,594 | 5/1986 | McPherson . | |
| 4,646,128 | 2/1987 | Carson et al. | ............................. 357/74 |
| 4,823,233 | 4/1989 | Brown et al. . | |

(List continued on next page.)

FOREIGN PATENT DOCUMENTS

| | | |
|---|---|---|
| 0 153 650 | 9/1985 | European Pat. Off. . |
| 0 594 395 | 4/1994 | European Pat. Off. . |
| 0 746 022 | 12/1996 | European Pat. Off. . |
| 1381952 | 11/1964 | France . |
| 1514477 | 4/1969 | Germany . |
| 2514123 | 10/1975 | Germany . |

(List continued on next page.)

OTHER PUBLICATIONS

IBM Technical Disclosure Bulletin, vol. 36, No. 06A, Jun. 1993; Dense High Performance Maintenance Package, pp. 111–114.

IBM Technical Disclosure Bulletin, vol. 32, No. 3B, Aug. 1989; Process For Producing Lateral Chip Connectors, pp. 410–411.

(List continued on next page.)

*Primary Examiner*—Leo P. Picard
*Assistant Examiner*—Michael Datskovsky
*Attorney, Agent, or Firm*—Griffin, Butler, Whisenhunt & Szipl, LLP

[57] ABSTRACT

The invention discloses a three-dimensional module with the use of volume unpackaged and film electronic components.

Between the independent electronic components comprising IC chips and the microboards comprising active and passive electronic components are disposed intermediate multifunctional boards. All module members are fabricated mostly from heat conductive materials, and together with the module's heatsinks make up an effective heat dissipation system. The microboards and intermediate boards further contain film active and passive components fabricated using semiconductor, thin film and thick film techniques and increasing the operational range of equipment. The proposed design is versatile and can be used in any-purpose electronic equipment.

The module structure allows its application under severe operational conditions and increases the packing density up to the technological limit.

Disclosed are cost-saving techniques of module assembly by means of capillary soldering or with the help of elastic elements.

18 Claims, 11 Drawing Sheets

U.S. PATENT DOCUMENTS

| | | |
|---|---|---|
| 4,858,073 | 8/1989 | Gregory . |
| 4,868,712 | 9/1989 | Woodman ................................ 361/388 |
| 5,016,138 | 5/1991 | Woodman ................................ 361/381 |
| 5,055,637 | 10/1991 | Hagner . |
| 5,107,586 | 4/1992 | Eichelberger et al. . |
| 5,128,831 | 7/1992 | Fox, III et al. . |
| 5,218,516 | 6/1993 | Collins et al. . |
| 5,345,205 | 9/1994 | Kornrumpf ................................ 333/246 |
| 5,373,189 | 12/1994 | Massit et al. ............................ 257/686 |
| 5,377,077 | 12/1994 | Burns . |
| 5,434,745 | 7/1995 | Shokrgozar et al. .................... 361/735 |
| 5,546,274 | 8/1996 | Davidson . |
| 5,688,721 | 11/1997 | Johnson .................................. 437/203 |

FOREIGN PATENT DOCUMENTS

| | | |
|---|---|---|
| 25 32 670 | 2/1976 | Germany . |
| 3321320 | 12/1983 | Germany . |
| 39 30 858 | 3/1990 | Germany . |
| 39 42 392 | 6/1990 | Germany . |
| 91 13 498 | 4/1992 | Germany . |
| 41 29 056 | 3/1993 | Germany . |
| 93 07 386 | 10/1993 | Germany . |
| 42 23 371 | 1/1994 | Germany . |
| 43 03 908 | 8/1994 | Germany . |
| 44 10 467 | 1/1995 | Germany . |
| 195 06 664 | 2/1996 | Germany . |
| 4-101491 | 4/1992 | Japan . |
| 4-287391 | 10/1992 | Japan . |
| 4-354174 | 12/1992 | Japan . |
| 683729 | 4/1994 | Switzerland . |
| 2 095 039 | 9/1982 | United Kingdom . |
| 2 127 217 | 4/1984 | United Kingdom . |
| 2 204 184 | 11/1988 | United Kingdom . |

OTHER PUBLICATIONS

Electronics Week, Sep. 3, 1984, No. 21, p. 20, Waterproof, Long–Lived Epoxy Chip Carrier for PC Boards Finally Sees the Light at the End of the Tunnel.

Dense–Pac Microsystemś 32 Megabit CMOS SRAM, Preliminary pgs. 245, 529 and 534.

Cubic Memory "Entering A New Era" Electronics, 1984, No. 21, pgs. 1–9.

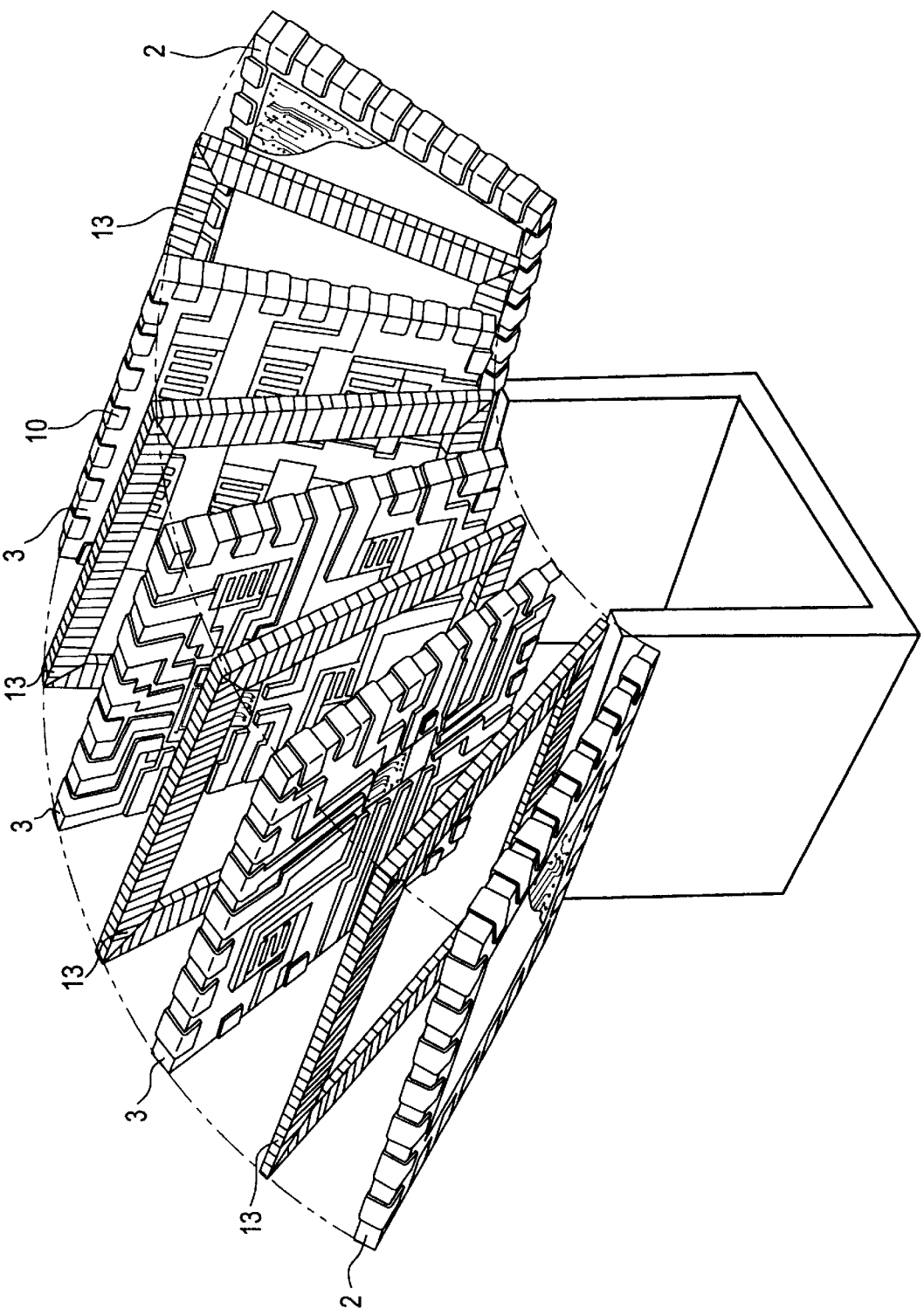

THREE-DIMENSIONAL ELECTRONIC MODULE

FIELD OF THE INVENTION

The present invention relates to electronic devices comprising unpackaged volume and film electronic components arranged in three-dimensional space. More particularly, this invention describes a three-dimensional electronic module.

BACKGROUND OF THE INVENTION

Reference is hereby made to UK Pat. No. 2095039 A H05 K 7/14, Date of Patent Feb. 10, 1982, and U.S. Pat. No. 4,823,233 H05K 7/20, Patent Date Apr. 18, 1989.

A circuit assembly includes a mounting structure having walls with conductor strips running along the length of the structure. Plate members carrying components such as integrated cicuits have conductive areas which contact the conductor strips when the members are inserted into the structure. The walls may include slots into which the plate members are slidably engaged. The support structure thus provides physical support for the members as well as electrical interconnection therebetween. Cooling arrangements for the assembly can include apertures in the walls and/or finning.

The disadvantages of this construction are as follows:
all electrical interconnections between the plates are by slidable contacts in the walls of the mounting structure, which considerably reduces the reliability of the assembly;
complete disassembly of the construction is necessary when repair is needed, because no plate can otherwise be removed.
apertures in the walls and/or finning reduce the density of packing many times and make the assembly comparable to the conventional methods of assembly.

The Patents of interest also include U.S. Pat. No. 5,373, 189 HO1L 23/02, Dec. 13, 1994.

A three-demensional multichip module having a plurality of bidimensional elementary electronic modules, each incorporating at least one chip, a support on which is placed the chip and a conductive interconnection network or array covering an upper surface of the support. These elementary modules are substantially superimposed and are interconnected by means of their interconnection networks. The underside of a support has a cavity appreciably greater than that of the chips so that the carrier of the first elementary module must be above the chip located on the second elementary module. Each elementary module. Each elementary module has at least one contacting area or short bonding pad disposed on one plane of the support and connected with the chip through interconnection networks; every pad has contact with the pads of the adjacent elementary modules (upper module and bottom module) in order to provide electrical connection between elementary modules. The electronic modules are arranged essentially one above the other and displaced, being protected from one another so that the pads of each carrier did not cover the carrier of the upper electronic module, and that is why, the electrical contacting between the wires of said pads is allowed. Each electronic module has a plurality of crystals interconnected by means of interconnection networks.

This design has all limitations of a traditional stack module: heat removal from each carrier and from the module as a whole is not provided for; modules are bound to be of different hight depending on their content and particular application, hence, inefficient space utilization when module is assembled on the backplane (FIG. 3a); if a number of external leads is large, they collect on the bottom carrier thereby increasing its size, while close spacing of the external leads makes multilayer mounting on the backplane expensive and unreliable. Furthermore, the carriers are interconnected only through the pads and by soldering of wire leads with the result that the overall number of interconnections increases, with a loss in the structure reliability.

In a memory module configuration developed at company Cubic Memory, the starting component is wafer segment comprising four die of dynamic memory 16 Mbit each. This wafer segment is sliced from a semoconductor plate 8 inches in diameter, ground to 0.2–03 .mm thickness. Each wafer is covered with an insulating polyamide film in which windows are disposed through normal photo lithographic technique on die contact pads. Traces are disposed on the surface of the wafer to interconnect the die and to form external zones of conducting for each wafer. A second insulating film may be applied, windows provided and traces disposed because in memory circuits it is necessary to connect in parallel a large number of contact pads lying in the same plane. The wafers are joined by vertical volume buses which penetrate to the bottom layer forming the module's exit contacts intended for the surface-mount of the module. This configuration may use wafers not only with four die, but with three suitable die as well. CAD provides all possible arrangements for wafers with any disposition of the suitable die. The wafers are not subjected to burn-in but rather are controlled on a warmed up table.

Having all shortcomings of a conventional stack module, this design aims to obtain a "pure" memory and does not provide for a controller, decoupling capacitors and other "strapping" elements, in other words, the structure is not versatile. Furthermore, an attempt to keep the module hight as small as possible resulted in a loss of over 70% of serviceable die not included into the "threes" and "fours" of the operating wafers. The structure is expensive to manufacture (on a level of air-borne equipment), and not very reliable in operation on the account of the elimination of the burn-in step.

Dense-Pac company has attempted to circumvent the last-mentioned shortcoming for a structure comprising 2 modules of 8 minipackages each with static memory chips in each module. The modules and decoupling capacitors are mounted on the backplane with external pins. The packages are interconnected along the module edges in a bus-type mode. Since the physical volume of this package is 16 times that of the Cubic Memory structure, convective heat dissipation creates better thermal conditions. Not only "pure" memory has been attempted but all circuitry was mounted on the backplane in order to imitate a complete memoty cuircuit. However other disadvantages of a stack packaging could not be avoided, and packing density remained low due to the use of packaged components.

U.S. Pat. No. 5,016,138 H05K 7/20, May 15 1991 and U.S. Pat. No. 4,868,712 H05K 7/20, Sep. 19, 1989, disclose three-dimentional integrate circuit packages.

These inventions are for an improved package and packaging technology for chips from which circuit modules are formed which are denser and easier to manufacture than previously existing techniques allowed.

In accordance with these inventions, at least one chip is mounted on each of a plurality of substrates, commonly ceramic, each of which has electronically conducting traces for carrying electronic signals. The chips connect electrically to the traces by means such as wire bonds, flip-chip bonding ot TAB bonding. At least certain o the traces extend to edges of the substrate for the purpose of making electrical connections from the chips on the substrate to external circuitry. Other traces may extend from one edge of the substrate to another edge to allow the pass-through of an external signal. Other traces may extend between multiple chips on this single substrate which contains more than one chip. Pins which extend from the edge of the substrate are connected to the pattern of traces on each layer. A substrate may contain multiple layers of traces for the distribution of signals, power or ground voltages and currents. Two or more substrates are connected together, one on top of the other, to form a dense stack of electronic circuitry. Between each layer, a window frame spacer, commonly ceramic, surrounds and protects the chips. Thus, the layer consists of a substrate, traces, chips and external connections.

Side interconnection plates (SIP) electrically connect between layers. A SIP is a subsrtrate, commonly ceramic, on which appropriately placed conducting traces are formed. The SIP is coupled to receive and supply signals from and to the external conductors of each layer. At least one trace on a SIP can be so configured as to connect to each layer within the stack such as for a bus signal, ground or power supply.

Through the use of layer pass-throughs and SIPs, signals may be routed anywhere around or within the stack. SIPs may have multiple layers of traces. Three basic configurations are proposed for making external connection from the stack.

A first device uses an external side interconnection plate (ESIP). An ESIP ia similar to SIP except that ESIP is larger than the side of the stack to which is connects and certain traces on the ESIP extend beyond the edges of the stack and terminate in lands of sufficient size to receive a wire bond. A module subassembly consists of a stack, SIP(s) and ESIP and is mounted within a package base. Package pins for external connection to the completed device penetrate and terminate within the package base. Using standard integrated circuit wire bonding techniques, the ESIP bond pads are bonded to the package pins. A cap covers the stack, SIP and ESIP assembly to protect the stack from mechanical damage and to provide an hermetic seal.

A second configuration used for making external connections from the stack connects the stack to a base plate out of which extends an array of pins, similar to standard pin grid array (PGA) single chip package. Conductive traces are formed on a substrate, usually ceramic, forming the base. The base may contain multiple layers of traces as required by the specific application being implemented. Pins penetrate the layer and are electrically coupled to the traces. The traces extend to those edges which correspond to the edges of the stack to be coupled to SIPs. SIPs connect to the base as if the base was simply another layer in the stack.

A third configuration connects the stack to a second PGA-like base. In this configuration the connectors on the edges of each layer connect to the PGA base plate as if it were a SIP. Vias and traces connect the connectors on the edges of each layer to the pins on the bottom of the PGA package. If the connectors on the edges of the layers are pins then the PGA package package pins will only reside around the periphery of the base plate.

Due to high circuit density, certain applications may require that means be provided for cooling the stack. One such means for the ESIP-type module includes attaching a heat sink to the outside of the package base. Another means includes interspersing heat sink members at predetermined intervals within the stack. A third means includes interspersing liquid cooling layers at predetermined intervals within the stack.

The above configuration has distinct advantages over other attempts to tackle the heat dissipation problem, although not in the wholly rational way (convection, liquid cooling), with a result that there is a considerable loss in the packing density. The side interconnection plates make the stack virtually inaccessible for repair after assembling. The original embodiment has some of the disadvantages inherent in conventional stack modules, as is discussed in the analysis of U.S. Pat. No. 5,373,189 (except for the heat dissipation system); the embodiments presented in FIGS. 6 and 7 are free from any of the drawbacks of the stack-type module and fulfil the purpose well, however the size of the module considerably increases; the layers are joined togerther by soldering (FIGS. 13, 14, 15), which makes the structure virtually inaccessible for repair and greatly hampers the testing during assembly. In an attempt to reduce the hight of the stack, several chips (4–16) connected in parallel are mounted on each layer, which inevitably results in a multilayer pattern of each layer and, correspondingly, reduces the relaiability and increases manufacturing difficulties.

U.S. Pat. No. 5,434,745 H01L 21/18, Jul. 18, 1995, discloses a stacked silicon die carrier assembly and method for packaging and interconnecting silicon chips such as memory chips. The carrier is constructed from a metalized substrate onto which the chip is attached. The chip is wire bonded to the conductor pattern on the substrate. Each conductor is then routed to the edge of the substrate where it is connected to a half-circle of a metalized through-hole. A frame is attached on top of this substrate. This frame has also a pattern of half-circle metalized through holes that allign with the holes in the bottom substrate. The combination of the bottom substrate with the silicon die, and the frame on top, forms a basic stackable unit. Several such units can be stacked and attached on top of each other. The top unit can finally be covered with a ceramic lid that also has a matching half-circle metalized through hole pattern along its edge. To electrically interconnect the stacked assembly conductive epoxy can be applied in the grooves formed by the aligned half-circle plated through holes.

This structure has the same shortcomings as those pointed out for U.S. Pat. No. 5,373,189, Additionally, it is known, that construction in this patent repeats the decision, shown in two articles by Kavin Smith (Electronics, 1984, No. 21, p.p. 21,22)

All of the above-mentioned patents relate to three-dimensional modules and directly provide for significantly better technical characteristics of electronic equipment than previously existing traditional techniques allowed.

The closest analog to the present invention is U.S. Pat. No. 5,016,138 H05K 7/20, May 14, 1991.

As is evident from the above analysis, the principal goal in the development of multichip IC has been to use 3-D space so as to achieve high density integrated circuit packages and to improve other properties of electronic equipment. This poses a number of problems such as providing interconnections between the elements, heat dissipation, maintainability and simplicity of manufacture. The present invention aims, in particular, to provide solutions to these problems.

SUMMARY OF THE INVENTION

It is an object of the present invention to provide a three-dimensional electronic module comprising constituent elements such that would make it possible, by using semiconductive, thin film and thick film techniques, to obtain a maximum packing density, to reduce the size and mass of electronic equipment down to the technological limits, to improve its reliability and interference-killing characteristics as well as to ensure its work under severe operational conditions without considerably increasing the manufacturing difficulties as compared with the fabrication of conventional equipment.

In accordance with the present invention, the three-dimensional electronic module comprises a plurality of separate electronic components disposed directly within the module, as well as volume unpackaged components disposed in the windows and niches of the parallel microboards electrically interconnected along the zones of contacting running around the periphery, said module is provided with external leads and a heatsink and is hermetically sealed; in accordance with this invention the module comprises at least one monolith mixed component preferably on a semiconductor substrate and having both active and passive zones; between separate electronic components and/or mixed components, and/or microboards there is at least one intermediate board having around its perpihery an electrical connection with the adjacent module members; the separate electronic component and/or mixed component and/or microboard and/or intermediate board connects electrically on the edge face to at least one module external lead extending through the hermetic envelope and electrically contacting the external commutation board; furthermore, separate electronic components, mixed components, microboards and intermediate boards electrically connected with one another along at least one edge of the module, have their plane surfaces facing the external commutation board; the separate electronic component, mixed component, microboard or intermediate board contain at least one film active and/or passive electronic component formed by conventional semiconductive, thin film or thick film techniques: the electrical connection between the constituent members of the module is commonly by soldering with the use of the capillary effect.

The use of a mixed component containing active as well as passive components formed by semiconductive, thin film or thick film techniques considerably improves the operational capabilities of the module and packing density, because the number of passive components in digital equipment is many times that of the passive components. However the availability of mixed components necessitates the desighning and manufacturing of specialized IC which is cost-effective only in the large-scale production.

The accommodation between separate electronic components and/or mixed components and/or microboards of thin intermediate boards and the structure of these boards allows several problems to be solved at a time: much greater possibilities for arbitrary module patterns are provided because each intermediate board is a two-sided or multilayer printed circuit taking up practically no space; the external leads of the module are no problem due to the availability the on the intermediate board of the necessary number of metalized projections for contacting the module external leads: the intermediate boards eliminate the problems associated with bus tracing or break in the bus tracing by means of the zones of contacting which round the intermediate board, or by means of projections with the insulated zones of contacting; the thickness of the intermediate boards is such that a clearance between the module members is automatically maintained to allow soldering with the capillary effect.

The intermediate boards and microboards can contain through windows for the passage of unpackaged active and passive components, disposed on the adjacent module members and being of considerable thickness. In applications where the substrate of the intermediate board is fabricated from a material with low thermal conductivity, the intermediate board is to be provided with through windows of the maximum size to allow subsequent filling-in of heat-conductive lubricant (to improve heat dissipation during equipment operation).

For applications which require many external leads disposed on the intermediate board, a flexible intermediate board can be used. Then, on one or several sides of the intermediate board elongation are provided for arranging all the necessary external leads; during assembly, the board is bent along the edges of the module to achieve the required contact with the external commutation board, with practically no increase in the size of the module. In another configuration, the metalized projections on the flexible board can be bent in the shape of, for example, a semi-cylinder to optimize their rigidity. These projections can be used as the module external leads.

The provision of the intermediate boards does not exclude the use of metalized projections on other module members. The present invention provides the designer with wide possibilities for configuring the layout patterns as necessary for the particular application, because both sides (for the two-side layout) of the separate electronic components, mixed components, microboards and intermediate boards can be used. Notably, any of the module members (separate electronic component, mixed component, microboard, intermediate board) can be connected to the external lead of the module.

In certain applications, the microboard can be composed of a base on which volume unpackaged active and passive components are surface-mounted, and a window frame spacer to accommodate these components. The surfaces of the base and spacer contain connecting conductors (imitating a four-layer layout pattern), film components made by thin-film or thick-film techniques, and the zones of contacting to connect the base to the spacer and to the adjacent module members. The composite microboard can also contain one or several metalized projections to connect to the module leads.

The substrate of a separate electronic component, mixed component, microboard or connecting plate can be made from a suitable semiconductor and thus greatly expand the operational potentialities of the assembly. However the surfaces of the module members are to be properly be insulated before positioning the connective conductors.

In order to expand the operational capabilities of a module assembly and to increase the circuit density it is advisable that the face and back sides of the separate electronic components, mixed components, microboards and intermediate boards contain film active and/or passive components made by semiconductive, thin film and/or thick film techniques.

The substrates of all module members must be made of materials with high thermal conductivity: not only will this ensure good heat transfer from a heated component to the heat dissipation system but will also allow the heat accumulation effect to be used. Heat flow inside the module will be levelled out, to contribute to the reliability and durability of the electronic equipment. Since much of thermal energy is tranferred through the zones of contacting and soldered joints, it is advisable that the contacting areas be of maximum dimensions. In this way contact resistance between the module members will also be reduced.

Equipment with relatively small heat release includes heat conducting plates mounted on the module ends, or a heatsink arranged along one or several edges of the module. These devices take up little space and little affect the overall packing density. Heat is best removed by means of a heat conductive comb, with its fins brought into the heating zones proper. But the heat conductive comb takes up considerable area, and the overall packing density is slightly reduced.

The characteristic feature of the present invention is that all its constituent members are arranged so that their plane surfaces face the external commutation board ("stack on the side"), and the electrical interconnections between the module members run along one or all faces of the module, thus providing distinct advantages over the conventional stack assembly: efficient heat dissipation from every component; packing density on the external commutation board is not high and does not require multilayer stacking because as the number of the module members increases the area of contacting with the external commutation board similarly increases and the specific mount density remains unchanged; the packing density of the external members considerably increases being independent of the number of constituent elements in each module (and of their height difference, as opposed to stack modules).

Interconnecting the module members by means of capillary-effect soldering allows for automation and mechanization of the module assembly process by any suitable means such as dip soldering, wave soldering, infra-red heating or lazer soldering. The module component members can also be electrically interconnected with the help of selectively applied conductive paste or adhesive. But with these applications it is advisable to apply nondrying compositions so that the structure can be disassembled before making it completely hermetic.

The module members can be electrically interconnected by means of sectional conductive elastic spacers ("zebras"). This configuration is chiefly applied in the breadboarding of new equipment because it allows any component part to be readily removed and replaced. However on prolonged service this method reveals marked disadvantages because with time the spacer elasticity deteriorates, contact resistance increases and the module operating characteristics are changed. Instead of conductive spacers, ordinary elastic spacers can be used in combination with a flexible printed circuit board suitably bent to accommodate to the module components. This configuration is preferable where the module is to be disassembled sufficiently rarely but where stricter requirements are placed on the quality of interconnections and arbitrariness of layout (unlike the previous configuration, in this one arbitrary and low-resistance rather than series connections are used). Both the configurations can be used at relatively small amounts of heat release from the module members because the spacings between the component members are increased by the thickness of the elastic spacers.

The present invention will now be described by way of example with reference to the accompanying drawings.

BRIEF DESCRIPTION OF THE DRAWINGS

FIG. 2a shows an exploded view of a module assembled with the use of elastic parts.

DETAILED DESCRIPTION OF THE PREFERRED EMBODIMENT

Figure 1A:
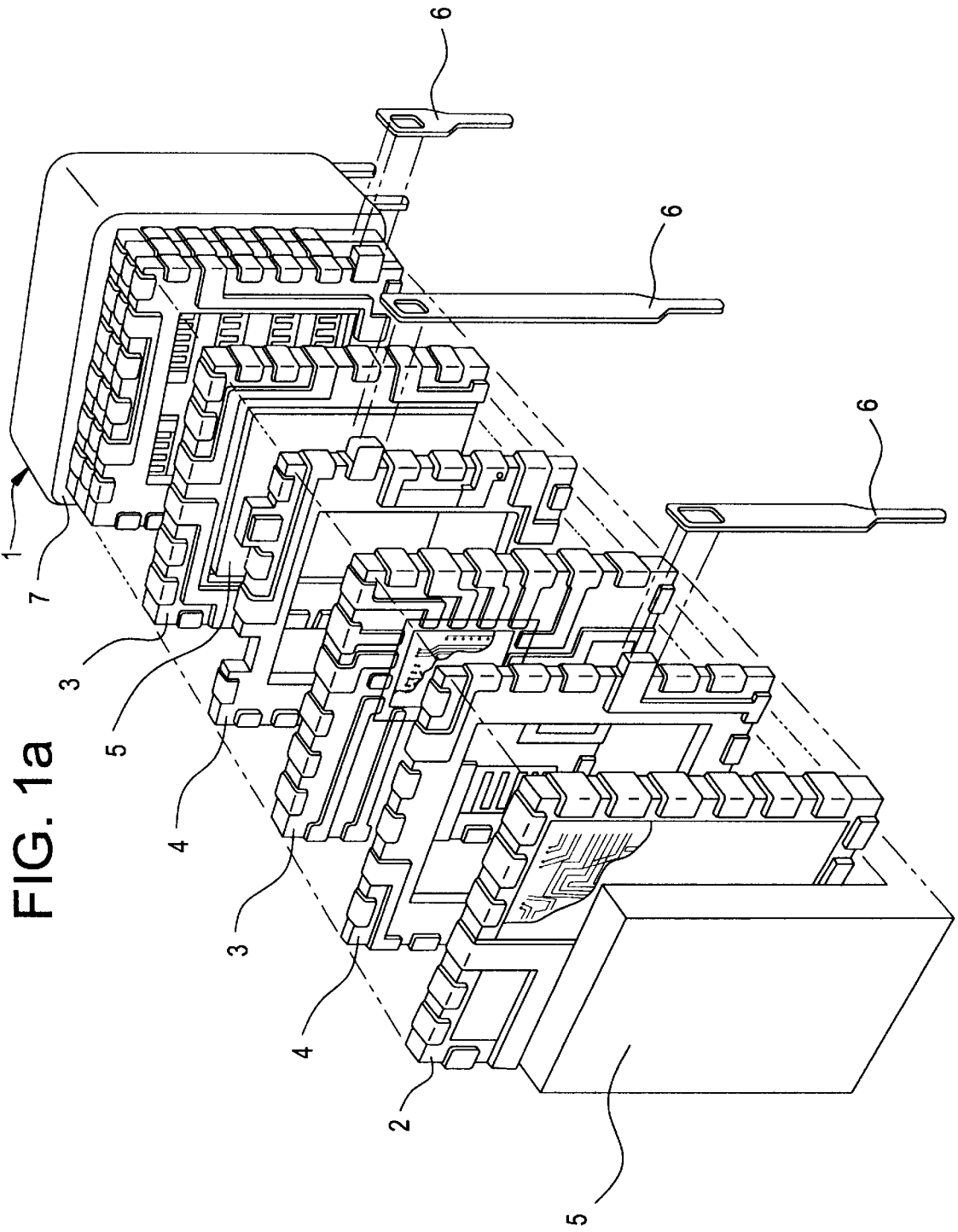
FIG. 1a shows a module assembled by soldering technique.

An embodiment of a three-dimentional electronic module 1 (hereinafter—module) in which electrical interconnections between parts are commonly made by soldering (FIG. 1a) contains separate electronic components 2, microboards 3, intermediate boards 4, heat conductive comb 5, external leads 6. In accordance with the configuration of module 1, separate electronic components 2, microboards 3 and intermediate boards 4 are assembled into a horizontal package and mechanically and electrically interonnected at the ends. After assembly and tesing, the module is hermetically encapsulated in 7.

Figure 1B:
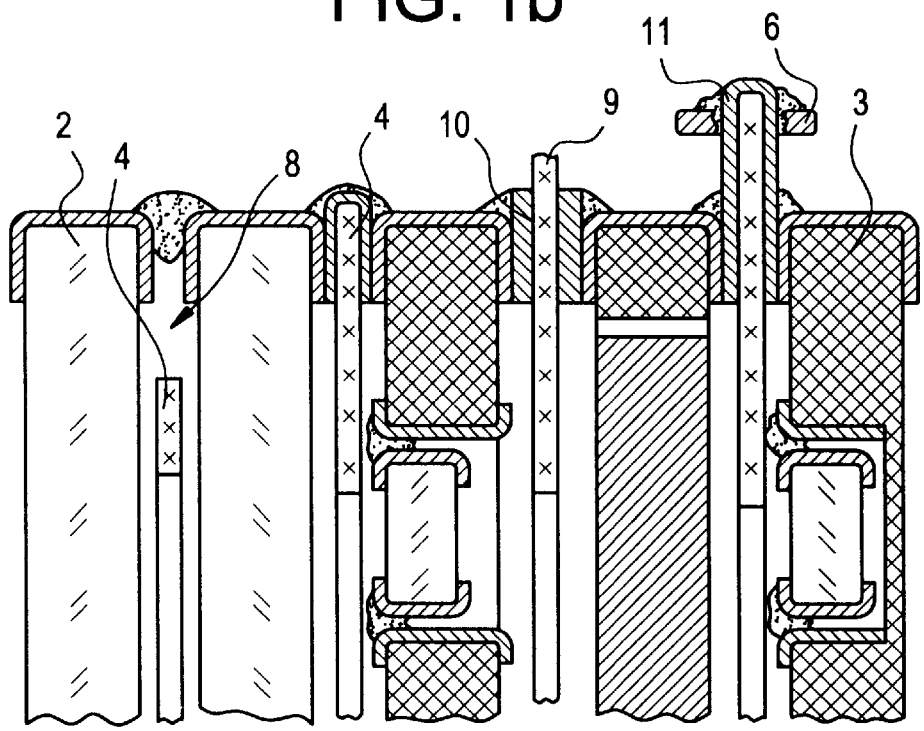
FIG. 1b depicts connections made using capillary soldering

An embodiment of module 1 is assembled by means of capillary soldering (FIG. 1b), intermediate boards 4 can be in direct contact with the adjacent members of the module; a notch 8 on intermediate board 4 provides for a direct contact between module I members (the thickness of intermediate board 4 gives the necessary space for capillary soldering), a projection 9 on intermediate board 4 with the separated zones of contacting 10 will secure, if necessary, break of the bus pattern; metalized projection II ensures the contact with external lead 6. In this embodiment, electrical connections can be performed bywave or dip soldering, lazer soldering, infra-red heating. The assembly can be readily repaired prior to complete hermetic sealing of module 1. This is accomplished by heating the point of attachment of the defective component, removal of the defective component, its replacement and soldering the circuit.

Figure 1C:
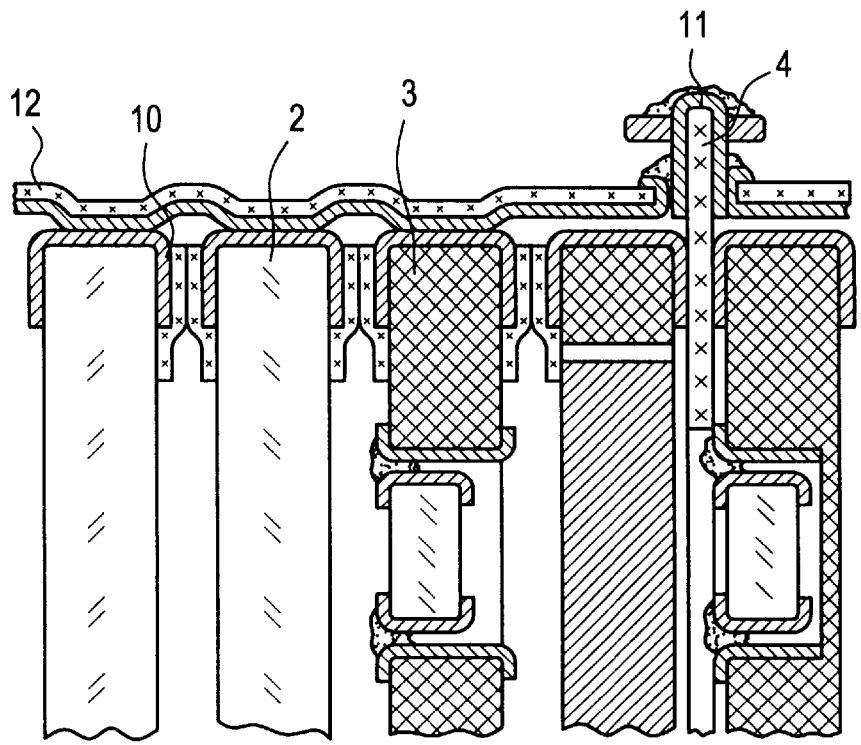
FIG. 1c depicts soldered connections with the use of a flexible printed circuit board

A commutation element can be in the form of a flexible printed board 12 (FIG. 1c), the conductors mounted on this board are soldered or welded to the plane surfaces of zones of contacting 10. In this configuration, projection 9 with separated zones of contacting, and metalized projection 11 on intermediate board 4 retain their functions on passing through the metalized holes in flexible printed board 12 and soldering in them. Compared with the embodiment in FIG. 1b, the present modification provides greater possibilities for external layout because flexible printed board 12 can have a two-sided or multi-layer arrangement of the conductors. But in this case, repair is difficult to perform: in order to remove the defective component it will be necessary to first remove or cut flexible printed board 12 and then to restore it.

Disassembly of module 1 before it is completely hermetically sealed can be achieved by means of elastic spacers interposed between the module 1 members (FIG. 2a). At the assembly stage, between separate electronic components 2 and/or microboards 3, and/or intermediate boards 4 are disposed sectional conductive elastic spacers 13 which electrically connect to the zones of contacting 10 in all module members. The sectional conductive elastic spacers 13 are fabricated as separate strips and are put around the circuit or on opposite sides of the mating parts of module 1. In FIG. 2a, intermediate boards 4 and external leads 6 are not sketched.

At the final assembly stage (FIG. 2b), the cavities formed between the module 1 members are filled with a heat-conductive lubricant 14 in order to ensure normal heat conditions during module operation. This embodiment is successfully realized by using a channel clamp as a heat sink, which is an additional fixing element of the structure Before the assembly is inserted into the spacing between the channel fins, it must be appropriately compressed to the required size. In order to obtain a module with high electrotechnical characteristics, sectional conductive elastic spacers 13 must have sufficiently low contact resistance (fractions of an Ohm).

Figure 2B:
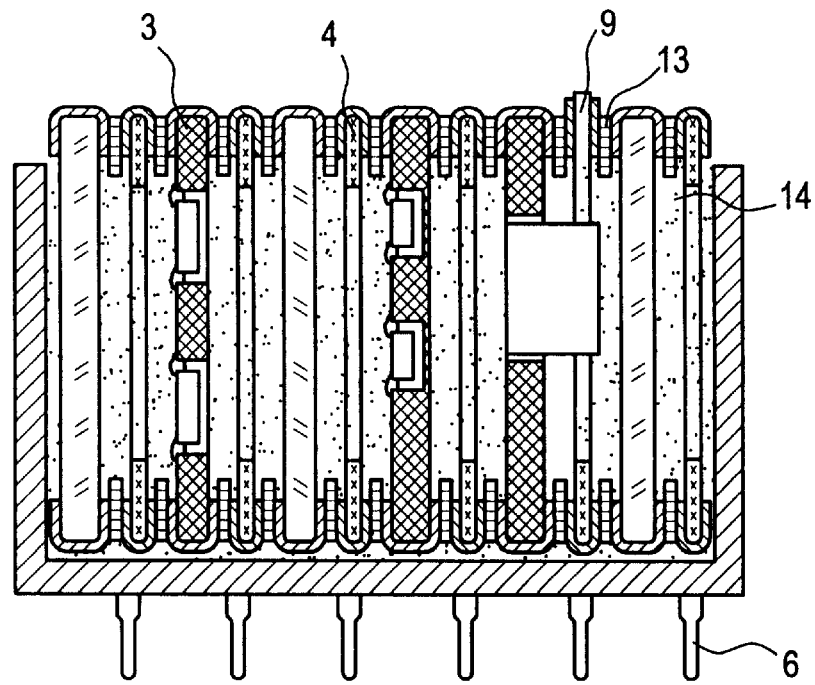
FIG. 2b depicts connections with the use of sectional conductive spacers
Figure 2C:
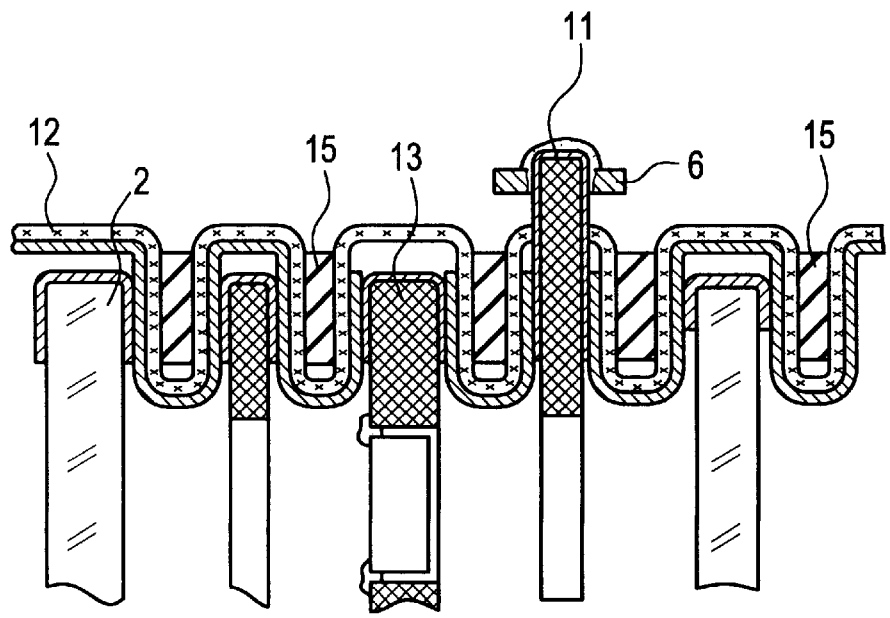
FIG. 2c depicts connections with the use of elastic spacers in combination with a flexible printed board.

This disadvantage can be avoided by using elastic spacers 15 in combination with a flexible printed board 12 (FIG. 2c). Flexible printed board is first bent and depressed between the electrically mated parts of module 1; elastic spacers 15 are placed in these depressions (cavities) and the assembly is compressed and inserted between the fins of the clamp. The advantage of this modification over the one represented in FIG. 2b is an arbitrary rather than series electrical interconnection of the module components to flexible printed board 12. The limitation of this configuration as of that in FIG. 2b, is residual deformation of the elastic spacers and ensuing increase in contact resistance.

Figure 3:
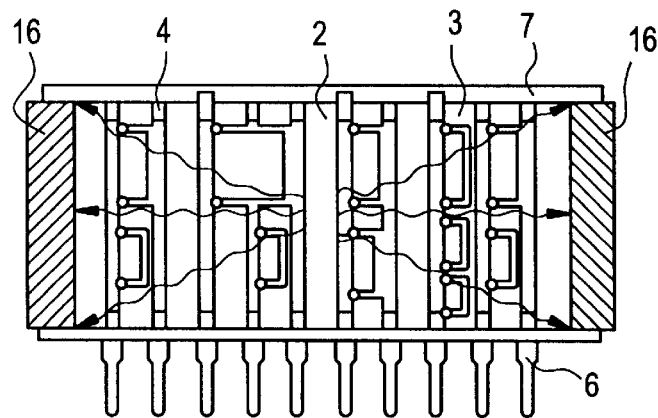
FIG. 3 shows a system for heat-dissipation from the sides of the module.
Figure 4:
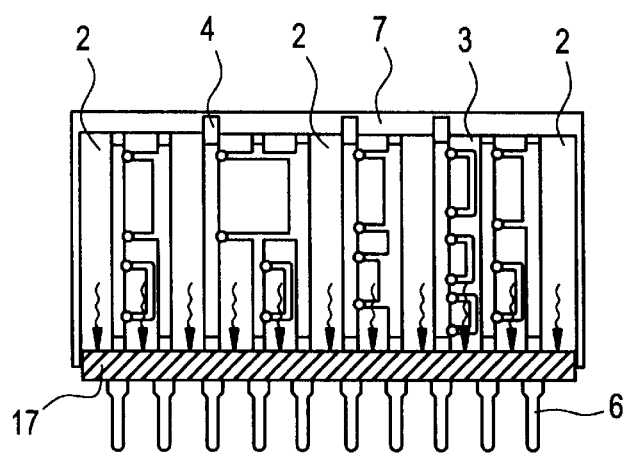
FIG. 4 shows heat sink for heat dissipation
Figure 5:
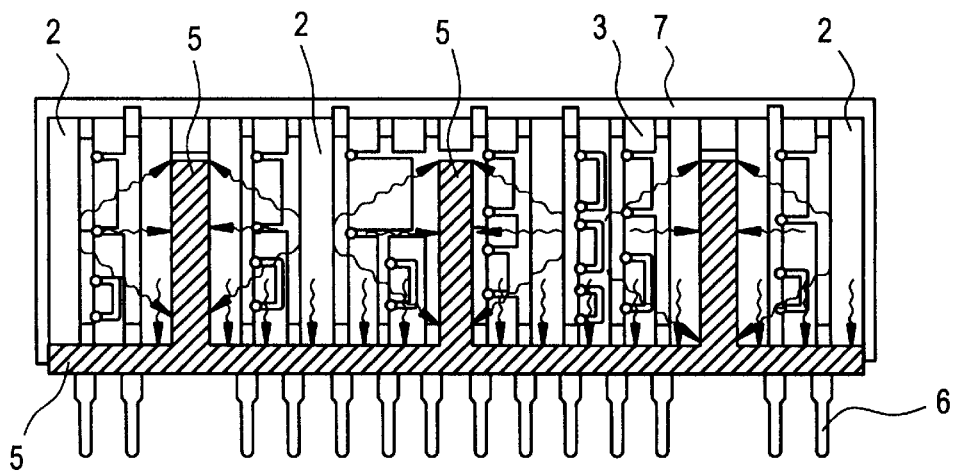
FIG. 5 shows a heat conductive comb

Heat can be conducted away from module 1 through its ends (FIG. 3). Heat sinks 16 are disposed on the ends of module 1 and extend to the external surface of module 1. Heat flow from the heat-releasing components will propagate horizontally to heat sinks 16. Those components that are disposed closer to the center of the module have the most heat load. This technique of heat dissipation applies where heat release is relatively small (not more than 10 W per module), at a total number of heat releasing components not more than 20. Since heat conductive sinks 16 take up little area, this method of heat dissipation provides for the highest packing density of the components in module 1. In FIGS. 3, 4, and 5, the wavy arrows show the direction of heat flow.

FIG. 4 shows a heat dissipation arrangement using a heat sink 17 which is disposed along one of the module edges and has thermal contact with all separate electronic components 2 and microboards 3 comprised in module 1. Thermal contact is achieved through heat conductive lubricant 14 applied to the surface of heat sink 17. This configuration can be applied where heat release from each component is not large (not more than 0.3 W per component), but heat sink 17 takes up relatively small space and does not significantly reduce the packing density of module 1. The number of heat releasing components is only restricted by the mechanical strength of module 1.

The most efficient heat dissipation system includes a heat conductive comb 5 (FIG. 5). In this configuration, heat flow from the heat releasing components closes is not directed only to the fins of heat conductive comb 5 (as in the method illustrated in FIG. 3), but heat released from each component also spreads to the base of heat conductive comb 5. The module configuration should provide that the fins of the heat conductive comb occur at the sites of the most heat releasing components. This method is to be used only for large overall heat release (over 10 W per module) and provides comfort operating conditions for electronic equipment. The number of heat releasing components is limited only by the mechanical strength of module 1. Heat conductive comb 5 takes up considerable space, which has a negative effect on the packing density of the module.

Figure 6:
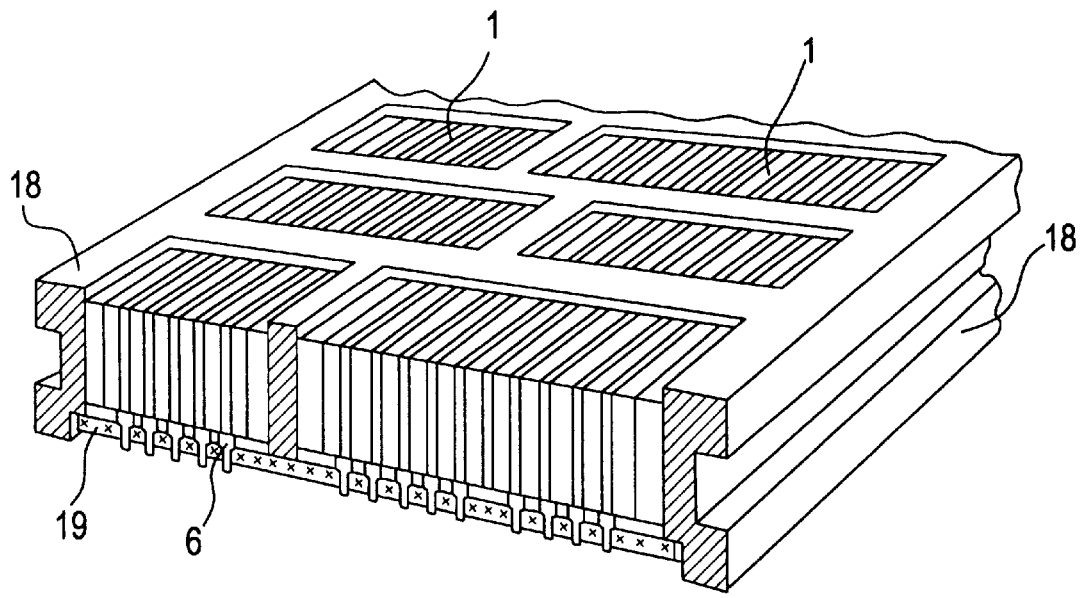
FIG. 6 shows a completed module assembly with the side heat sink

FIG. 6 presents an example of module 1 packing in which the heat sinks are disposed at the ends of module 1 (FIG. 3). The external heat sink 18 is in the form of a heat conductive grid of small heat resistance. The grid windows are to be made to high precision so that the minimal spacings are left after modules 1 have been inserted into the grid windows. A thin layer of heat conductive lubricant 14 is first applied to the vertical walls of the grid. The external commutation board 19 electrically coupled to modules 1 via external leads 6 is attached to external sink 18. Since in the modifications depicted in FIGS. 6 and 7 all module components are mounted so that their ends face the external commutation board 19, the external module connections are considerably spaced apart over the plane of the external commutation board 19, which practically eliminates the need for its conventional multilayer cuircuit packaging.

Figure 7:
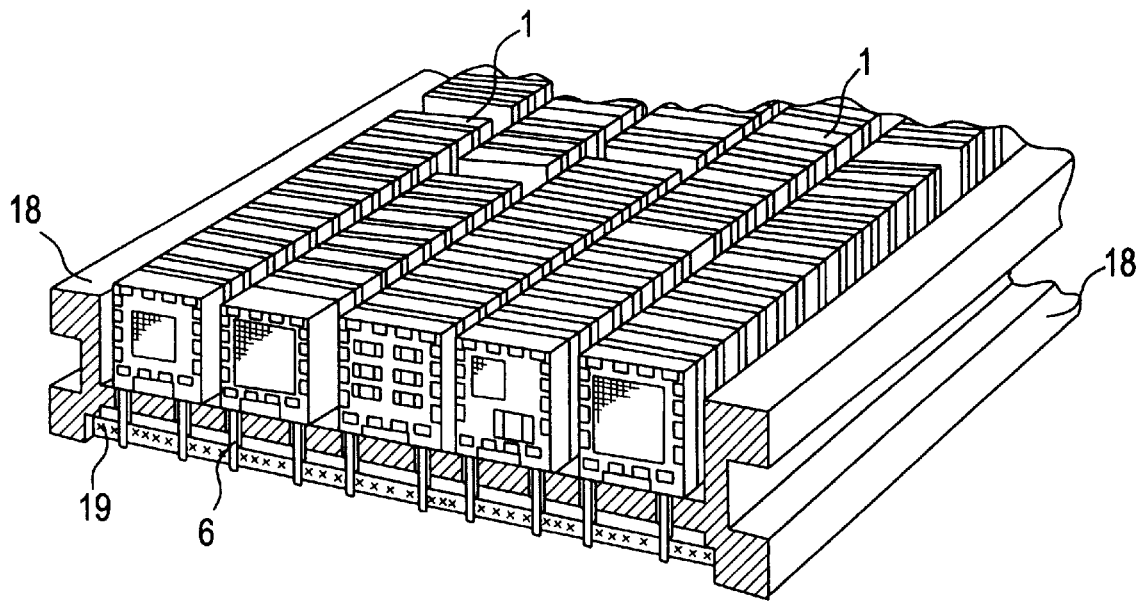
FIG. 7 shows a completed module assembly with a heat conductive comb or heat sink.

In configurations where heat is conducted away by means of heat sink 17 (FIG. 4) or heat-conductive comb 5 (FIG. 5), modules can be mounted as shown in FIG. 7. The external heat sink in this case is formed as a flat structure with windows through which pass external leads 6 of modules 1. Furthermore, external heat sink 18 must have flat surfaces to ensure thermal contact with heat sinks 17 or heat conductive combs 5. The bottom of external heat sink 18 is fixed to external commutaion board 19 which has electrical contacts with modules 1 through external leads 6. Before modules 1 are mounted, the sites of their thermal contact with external heat sink 18 are covered with a thin layer of heat conductive lubricant 14. This particular modification has some advantages over the one shown in FIG. 6, because it allows denser packing of modules 1 and has smaller mass. Any defective module 1 can be easily removed from the structures shown in FIGS. 6 and 7 and replaced.

Figure 8:
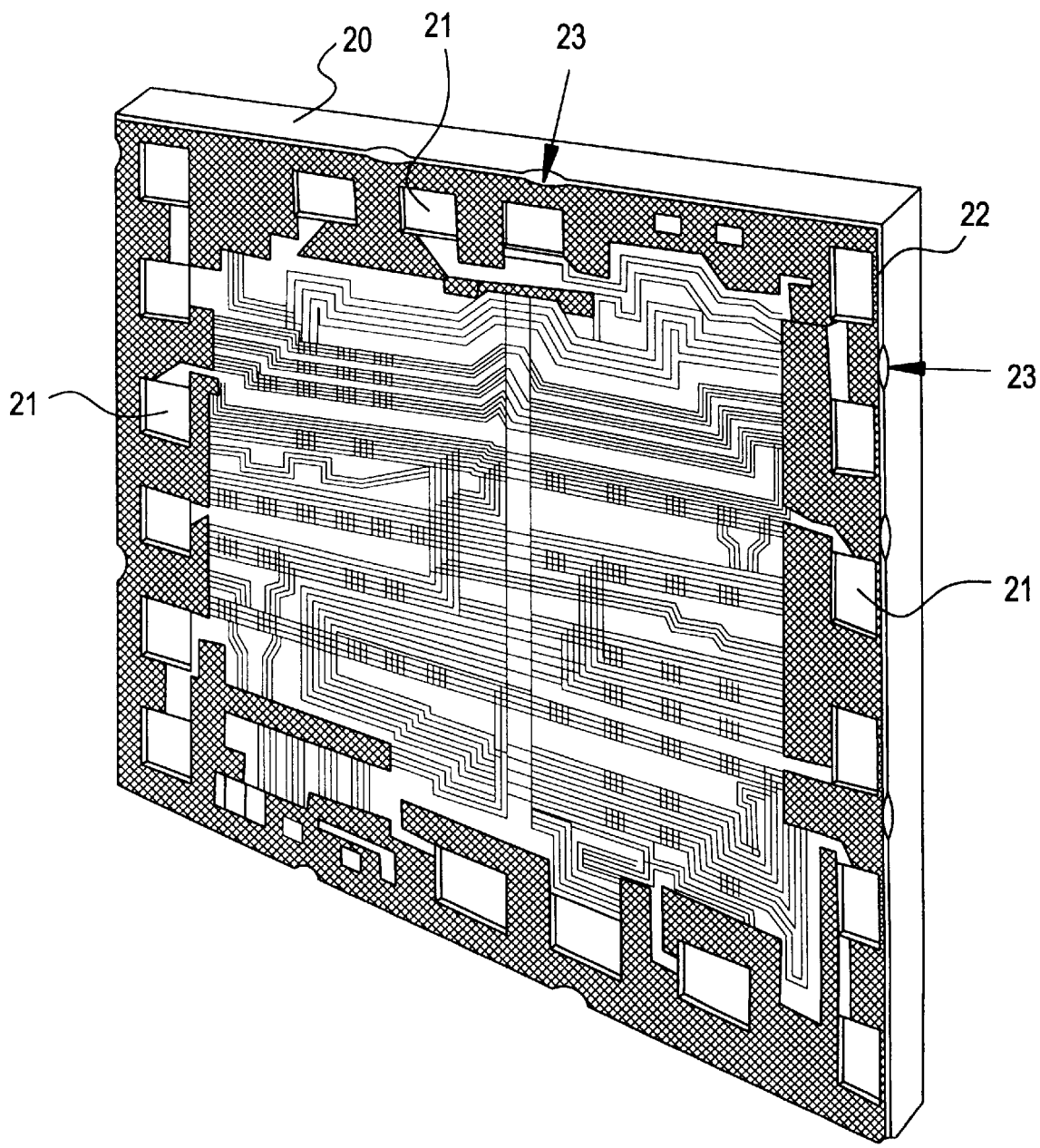
FIG. 8 shows a separate electronic component

In most cases, a volume unpackaged active component 20 of a maximum size affordable for a given module (FIG. 8) and obtained by dicing a preverified semiconductor wafer into die, can act as a separate electronic component 2. This is especially effective in memory modules where most chips are of the same size and have maximum dimensions for a given module. In integrated circuits, the chip, with the exception of bond pads 21 is protected with a passivating layer, but dicing inevitably produces spalling 23 which strips the protective passivating layer 22 off the chip plane. Bond pads 21 can be displaced relative to the end faces of the volume unpackaged active component 20.

Figure 9:
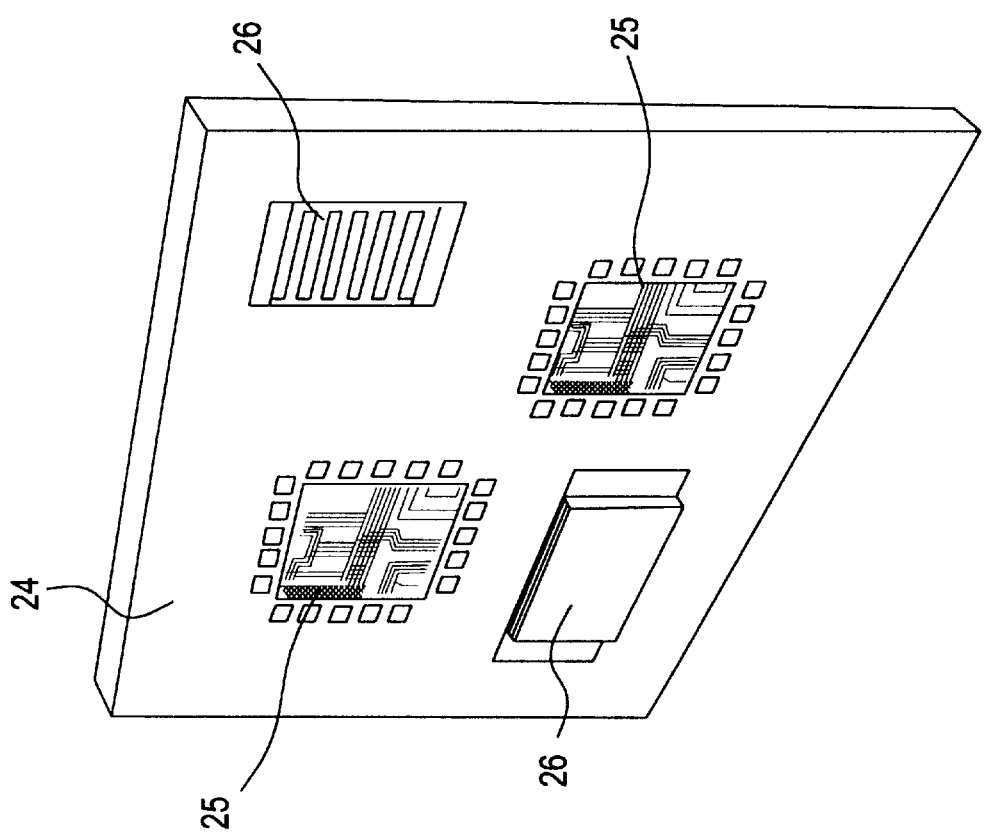
FIG. 9 shows a mixed component

In other modifications, a mixed component 24 (FIG. 9) may include apart from active zones 25, film passive components 26 formed using semiconductor, thin film or thick film techniques.

Figure 10:
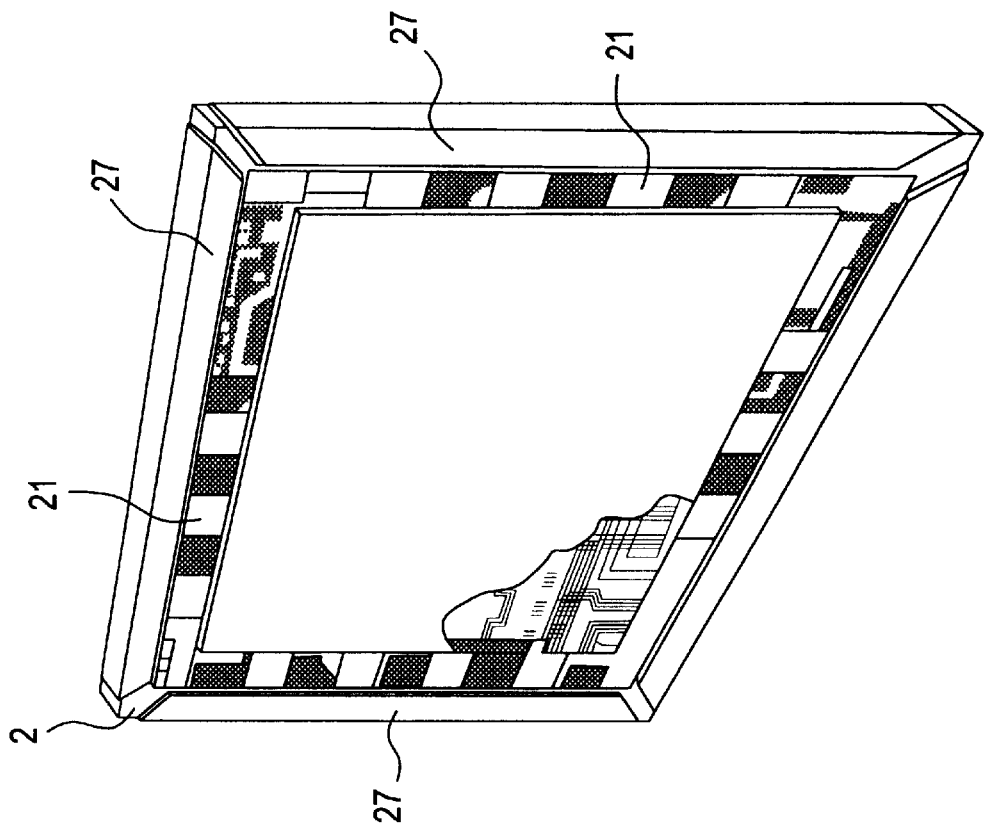
FIG. 10 shows a separate electronic component with an insulating layer selectively applied.

In order to insulate open parts of components 2 and 24 (FIG. 10), an insulating layer 27 is selectively applied to the front, end and back sides of components 2 and 24. In this case bond pads 21 disposed on the front sides of components 2 and 24 should be protected from insulating layer 27.

Figure 11:
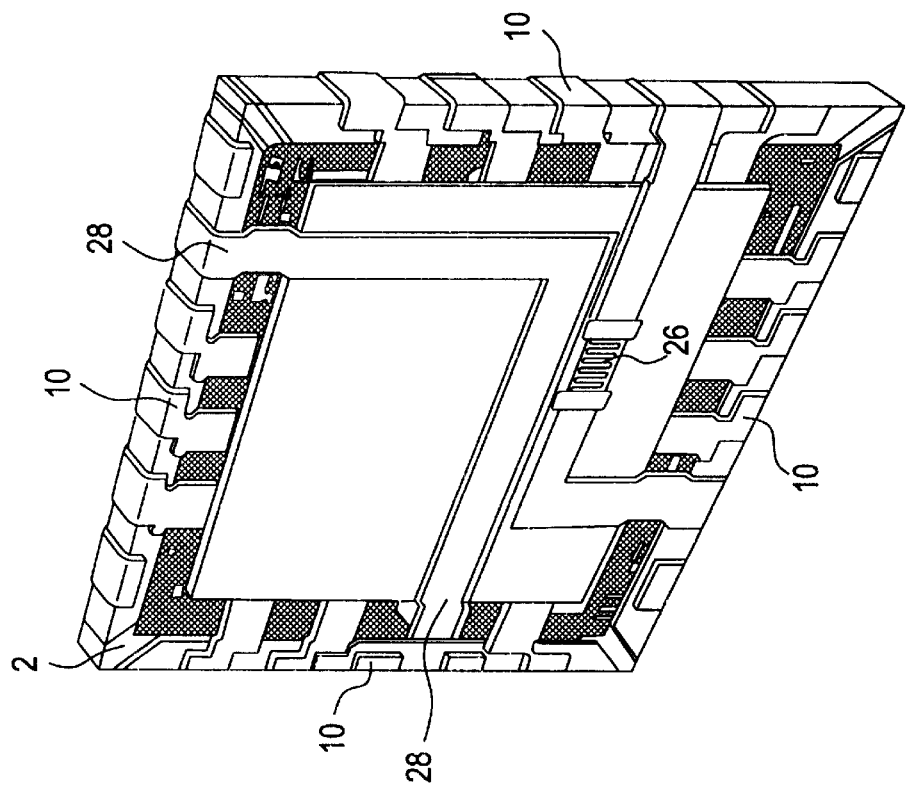
FIG. 11 shows a separate electronic component with the zones of contacting, conductors and a film component.

Next, the zones of contacting 10 and the connective conductors 28 are mounted on the front, end and back sides of components 2 and 24 (FIG. 11). Also, film passive components 26 obtained by thin film of thick film techniques can be formed on the front, side and back sides of components 2 and 24 over the insulating layer 27.

Notably, connective conductors 28 and film passive components 26 can be formed on the front sides of components 2 and 24 only when there are no stray capacitive coupling with the structures below. Connective conductors 28 must completely overlap bond pads 21. If necessary, the front and back sides of components 2 and 24 can be completely coated with an additional insulating layer, except zones of contacting 10.

Figure 12:
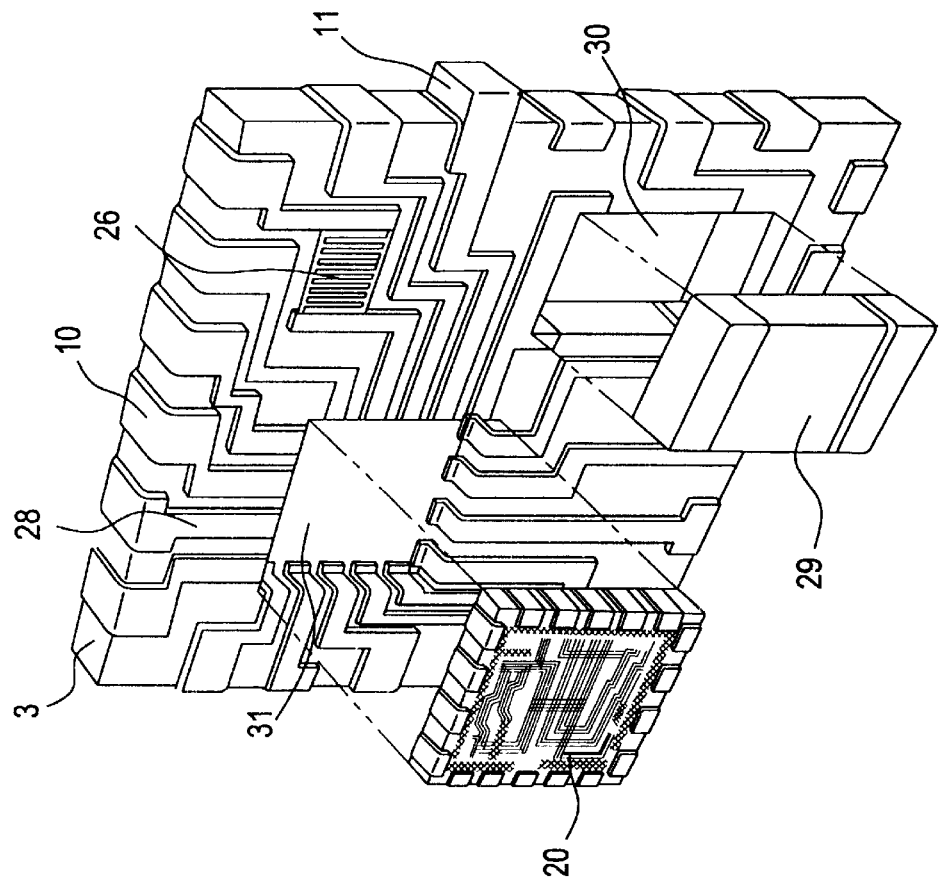
FIG. 12 presents a configuration of the microboard

All volume unpackaged active components 20 and volume unpackaged passive components 29 of smaller dimensions than separate electronic component 2, are brought <<inboard>> microboard 3 (FIG. 12), commonly of thermally conductive insulating material. Microboard 3 is provided with windows 30 and/or niches 31 for accommodating volume unpackaged components 20 and 29. Connective conductors 28 are placed on the front, end and back side of microboard 3. Also disposid on the surface of microboard 3 may be passive components 26 prepared by thin or thick film techniques. If microboard 3 is made from semiconductor material, it can additionally include active zones 25 as well as passive components 26 prepared by semiconductor techniques. In this case it is usually necessary to locally apply insulating layer 27 on the front, end and back sides of microboard 3, by analogy with unpackaged active component 20. The internal sides of windows 30 and niches 31 include conductors for electrical coupling to volume unpackaged electronic active components 20 and unpackaged passive components 29. Microboard 3 may have metalized projections 11 to provide contact with external leads 6.

Figure 13:
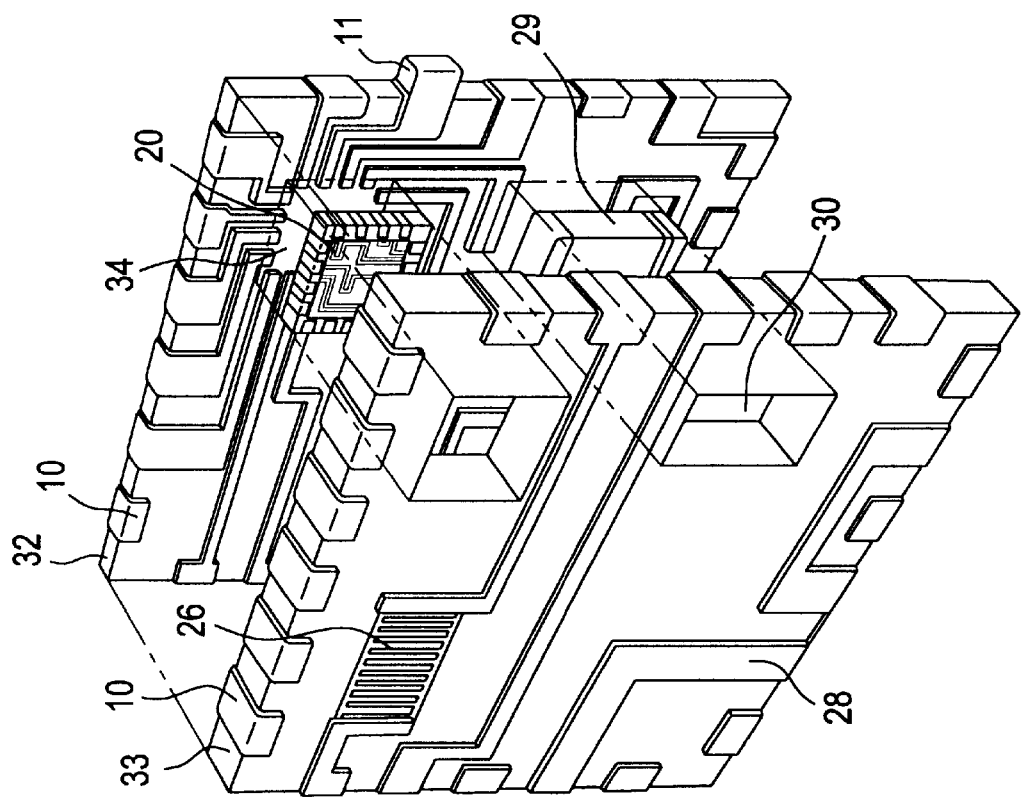
FIG. 13 shows a configuration of a composite microboard.

A microboard can be comprised of a base 32 and a bush 33 (FIG. 13). On the base surface 32 are disposed contact fields 34 on which volume unpackaged active components 20 and volume unpackaged passive components 29 are surface-mounted. Base 32 also contains zones of contacting 10 and connective conductors 29. If necessary, base 32 and/or bush 33 may have one or several metalized projections 11 for coupling to external leads 6. Bush 33 has through windows 30 for passage of components 20 and/or 29, zones of contacting 10, connective conductors 28. On the surface of base 32 and bush 33, film passive components 26 can be formed, said components are made using conventional thin film or thick film techniques. Base 32 and bush 33 are joined mechanically and electrically through zones of contacting 10. If base 32 and/or bush 33 are made form semiconductor material they may include additional active zones 25 or film passive components 26, but in this case the insulating layer 27 must be locally applied to the front, end and back sides of base 32 and/or bush 33, by analogy with volume unpackaged active component 20.

Figure 14:
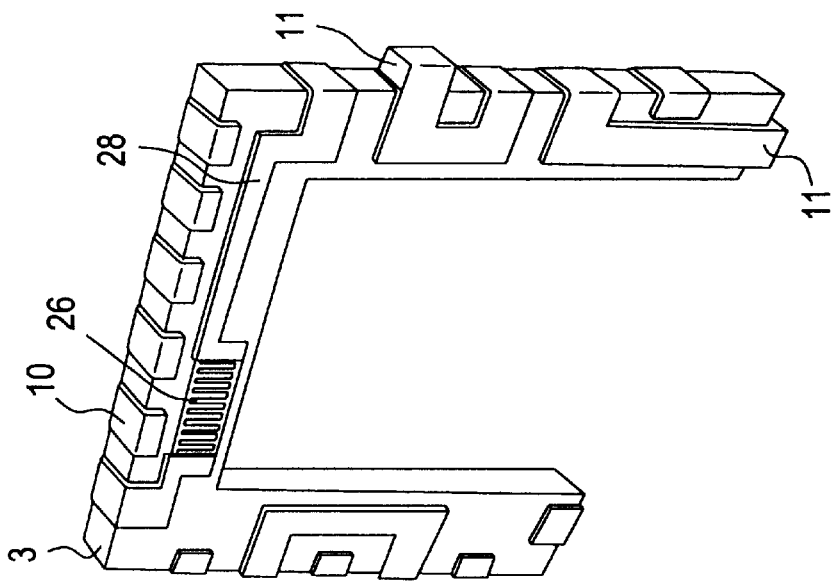
FIG. 14 shows a configuration of the microboard with a notch to accommodate the heat conductive comb.

In cerain cases, a notch should be provided in microboard 3 to accommodate the fins of heat conductive comb (FIG. 14). But this does not exclude the mounting on the microboard surface of zones of contacting 10, connective conductors 28, film passive components made by thin film of thick film techniques. The microboard may have metalized projections 11 for coupling with external leads 6.

Figure 15:
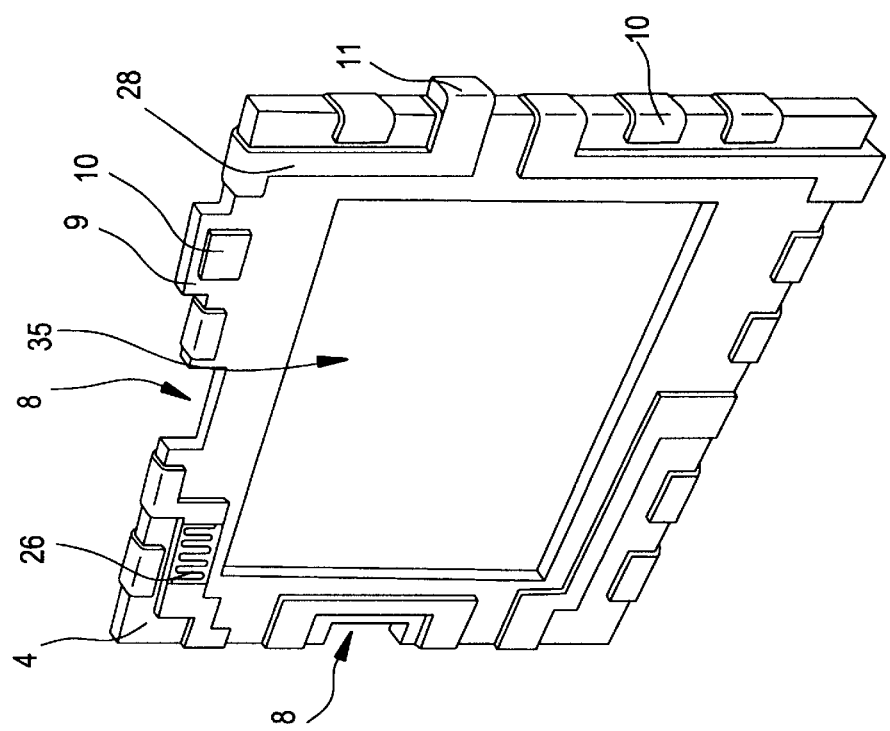
FIG. 15 shows a configuration of the intermediate board.

In FIG. 15, intermediate board 4 is commonly placed between separate electronic components 2 and/or mixed components 24, and/or microboards 3. Intermediate board 4 serves to increase the switching capacities of the module 1 assembly, closes the bus pattern, provides the necessary space for subsequent capillary soldering, has metalized projections 11 for external contacting. Intermediate board 4 has zones of contacting 10, connective conductors 28, notches 8 in order to join the components located on both sides of intermediate board 4, one or several through windows 35 which allow the application of heat conductive lubricant 14 at the stage of module 1 assemby, as well as projections 9 with insulated zones of contacting 10 for those applications when it may be necessary to break the bus pattern. If intermediate board 4 is made from heat conductive material, through windows 35 are not provided. Intermediate board 4 may have on its surfaces passive components 26 obtained using thin film ot thick film techniques.

Figure 16:
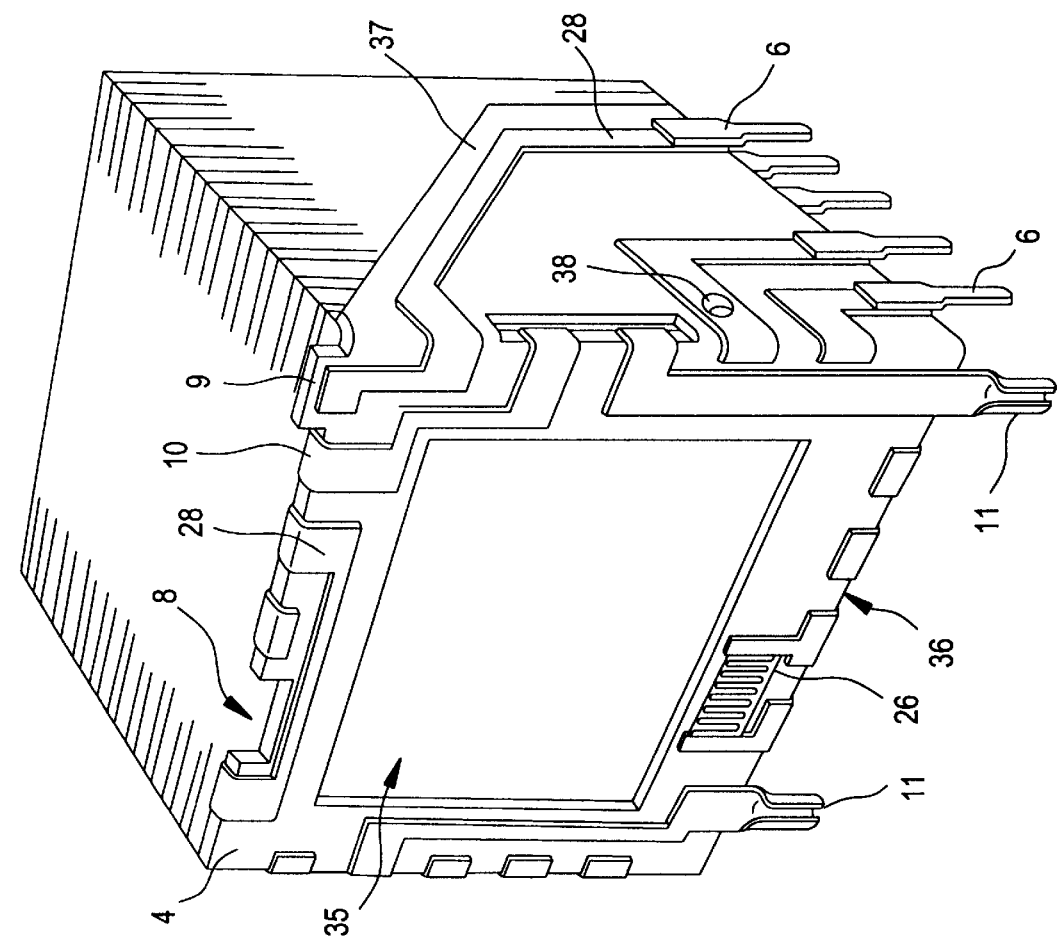
FIG. 16 shows a configuration of a flexible intermediate board

Intermediate board 4 can have a flexible substrate 6 (FIG. 16). This is useful when it is necessary to extend a plurality of external leads 6 from one intermediate board 4. In this case, an elongated projection 37 is provided on intermediate board 4 and disposed along one of module 1 edges at the stage of assembly; external leads 6 of the module are coupled to connective conductors 28. Flexible intermediate board 4 also has zones of contacting 10, connective conductors 28, through windows 35 and it can also include, to enhance the mechanical strength of the structure, projections 11 which have a semi-cylinder bend and can also serve as the module external leads. Metalized apertures 38 are provided for the electrical coupling of conductors 28 disposed at different sides of intermediate board 4.

The present invention can be used:
1. In designing computers of new generation having large memory capacity and capabilities for rapid information processing, manufactured in miniaturized enclosure and distinguished by improved reliability and extended service life.
2. In spacecraft industry in order to reduce many times the size and mass of electronic equipment while considerably improving its technical parameters.
3. In electronic industry for designing "circuits of the future generations" on the basis of present-day circuit technology.
4. In communication and telecommunication systems with the aim of designing superminiaturized equipment intended for global radiocommunication with objects located at any point on earth.
5. In the production of miniaturized domestic utensils with radically new consumers' properties: digital recorders and videorecorders, systems for lazer recording and reproduction of audio and video information, electronically-controlled filming and photo equipment.
6. In hidden security systems intended for industrial general service installations, capable of videorecording any violations of normal conditions.
7. In robotics for the development of miniaturized and moving systems for detection of people and other objects in roadblock and other difficult-to-access places.
8. In electronic equipment intended for operation in outer space and at elevated radiation levels.
9. In medical instrumentation design in order to create miniaturized diagnostic kits for emergency examinations of patients, radiopills to help conduct computer-aided internal examinations and operations, artificial limbs acting on command from the man's nervous system.
10. In designing remote control instruments intended for use in housholds and in agriculture, as well as in the creation of intellectual games.

I claim:
1. A three-dimensional electronic module comprising a plurality of separate electronic components arranged in the module proper as well as volume unpackaged components arranged in the niches and windows of the microboards placed in parallel and electrically interconnected along the zones of contacting disposed around the periphery; the module being further provided with external leads and a heatsink and has an hermetic envelope; the module contains at least one monolith mixed component, commonly on a semiconducting substrate and having both active and passive zones; between the separate electronic components and/or mixed components/and/or microboards there is disposed at least one intermediate board which is electrically connected around the periphery to the adjacent module components; the separate electronic component and/or mixed component and/or microboard and/or intermediate board is electrically connected on the end side to at least one module external lead penetrating through the hermetic envelope and having an electrical contact with the external commutation board; furthermore, the separate electronic components, mixed components, microboards and intermediate boards, electrically interconnected with one another along at least one edge of the module, face the external commutation board with their end faces; the separate electronic component, mixed component, microboard or intermediate board include at least one film active and/or passive electronic component formed by conventional semiconductive, thin film and/or thick film techniques.

2. The three-dimensional electronic module according to claim 1, wherein the intermediate board contains at least one metalized projection for electrical connection with the module external lead.

3. The three-dimensional electronic module according to claim 1 wherein the intermediate board includes at least one projection with the zones of contacting insulated from one another by the substrate material of the intermediate board.

4. The three-dimensional electronic module according to claim 1 wherein the intermediatre board includes at least one notch in the area of the zones of contacting for providing direct electrical connection with the adjacent module components, the intermediate board having the thickness sufficient to allow the capillary soldering of the module components.

5. The three-dimensional electronic module according to claim 1 wherein the intermediate board and/or microboard has at least one through window to pass-through the volume component disposed in the adjacent member of the module.

6. The three-dimensional electronic module according to claim 1 wherein the intermediate board has at least one through window filled with heat-conductive lubricant at the stage of module assembly.

7. The three-dimensional electronic module according to claim 1 wherein the intermediate board is executed on a flexible substrate allowing the intermediate board to be curved along at least one of the module sides during module assembly, on the curved portion of the intermediate board at least one external lead of the module being disposed.

8. The three-dimensional electronic module according to claim 7 wherein the flexible intermediate board has at least one metalized projection bent to optimize the rigidity of the structure.

9. The three-dimensional electronic module according to claim 1 wherein the face of the separate electronic component and/or mixed component and/or microboard and/or intermediate board contains at least one conductor which encompasses the front, back and end faces to form zones of contacting.

10. The three-dimensional electronic module according to claim 1 wherein the microboard has at least one metalized projection to provide the electrical connection with the module external lead.

11. The three-dimensional electronic module according to claim 1 wherein the microboard comprises the base having at least one volume unpackaged active or passive surface-mounted component, said base having at least one metalized projection for electrical coupling with the module external lead; the microboard also contains a bush having a through window to pass-through the volume electronic component mounted on the base, and it also electrically and thermally coupled to the base via the zones of contacting and the heat-conductive lubricant disposed between the base and bush.

12. The three-dimensional electronic module according to claim 1 wherein in the case of the substrate of the separate electronic component, mixed component, microboard or intermediate board manufactured from current-conductive or semiconductive material, their front, back and end faces contain an insulating layer selectively placed under the connecting conductors.

13. The three-dimensional electronic module according to claim 1 wherein the substrate of the separate electronic component, mixed component, microboard and intermediate board are preferably made from heat-conductive material, and during module assembly, the heat-conductive lubricant of the minimum thickness is dosed into the cavities between the module components.

14. The three-dimensional electronic module according to claim 1 wherein the heatsink is designed as at least one heat-conductive plate disposed on the end of the module which is parallel to the planar surfaces of the microboard and having thermal contact with the module members and penetrating through the hermetic envelope of the module to provide the thermal contact with the external heatsink.

15. The three-dimensional electronic module according to claim 1 wherein heat dissipation from the module is achieved by means of a heatsink disposed along at least one edge of the module, the edge being defined as edges of the microboard, and having a thermal contact with the module members and penetrating the hermetic envelope of the module to provide thermal contact with the external heat sink.

16. The three-dimensional electronic module according to claim 1 wherein the heatsink is a heat conductive comb with its fins extending into the zones of the heat-releasing members of the module and jointly with the comb base have thermal contact with them; here, at least one of the outer surfaces of the comb penetrates through the hermetic envelope to provide heat contact with the external heatsink.

17. The three-dimensional electronic module according to claim 1 wherein in order to electrically connect the module components by means of sectional current conductive elastic spacers, an element such as a clamp in the form of a channel is used to hold the module tightly together while providing for heat removal and is made from strong heat-conductive material.

18. The three-dimensional electronic module according to claim 8, wherein the electrical connection of the module components is by means of a flexible printed board; said printed board, first bent, is disposed to form cavities between the electrically coupled components of the module; the elastic spacers are located in the cavities: the previously compressed assembly is inserted in the clamp, and the electrical contact is provided between the zones of contacting of the module components and the conductors disposed on the flexible printed board, and also a thermal contact with the clamp via the heat-conductive lubricant applied to the clamp.

* * * * *